United States Patent
Yamaha et al.

[11] Patent Number: 5,821,162
[45] Date of Patent: Oct. 13, 1998

[54] METHOD OF FORMING MULTI-LAYER WIRING UTILIZING SOG

[75] Inventors: Takahisa Yamaha; Yushi Inoue, both of Hamamatsu, Japan

[73] Assignee: Yamaha Corporation, Japan

[21] Appl. No.: 679,738

[22] Filed: Jul. 12, 1996

[30] Foreign Application Priority Data

Jul. 14, 1995 [JP] Japan ................................. 7-201591

[51] Int. Cl.⁶ ............................................. H01L 21/4763
[52] U.S. Cl. ......................... 438/623; 438/781; 438/787
[58] Field of Search .................................. 437/238, 397.7, 437/126.2, 99, 235, 231; 438/623, 781, 787

[56] References Cited

U.S. PATENT DOCUMENTS

| | | | |
|---|---|---|---|
| 4,756,977 | 7/1988 | Haluska et al. | 428/704 |
| 5,059,448 | 10/1991 | Chandra et al. | 427/53.1 |
| 5,118,530 | 6/1992 | Hanneman et al. | 427/226 |
| 5,145,723 | 9/1992 | Ballance et al. | 427/397.7 |
| 5,336,532 | 8/1994 | Haluska et al. | 427/515 |
| 5,370,904 | 12/1994 | Mine et al. | 427/126.2 |
| 5,380,567 | 1/1995 | Haluska | 427/578 |
| 5,481,135 | 1/1996 | Chandra et al. | 257/701 |
| 5,506,177 | 4/1996 | Kishimoto et al. | 437/195 |

FOREIGN PATENT DOCUMENTS 6-181203  6/1994  Japan .
6-181204  6/1994  Japan .

OTHER PUBLICATIONS

B.T. Ahlburn, et al., "A Non–Etch Back Spin on Glass for 0.5μM Devices Using Hydrogen Silsequioxane as a Replacement for Methylsiloxane", Jun. 7–8, 1994, VMIC Conference, pp. 120–122.

B.T. Ahlburn, et al., "Hydrogen Silsesquioxane–Based Flowable Oxide as an Element in the Interlevel Dielectric for Sub 0.5 Micron ULSI Circuits", Feb. 21–22, 1995 DUMIC Conferernce, pp. 36–42.

D.S. Ballance, et al. "Low Temperature Reflow Planarization Using a Novel Spin–On Interlevel Dielectric", Jun. 9–10, 1992, VMIC Conference, pp. 180–186.

D. Pramanik, et al., "Reliability of Multilevel Circuits Using Hydrogen Silsesquioxane $FO_x$ for Interlevel Dielectric Planarization", Jun. 8–9, 1993, VMIC Conference, pp. 329–331.

"Application Notes for Dow Corning Flowable Oxide", pp. 1–4 No Date.

R. Dawson, et al., "Performance of Logic Devices Utilizing A Novel Spin–On Dielectric Planarization Process", Jun. 8–9, 1993 VMIC Conference, p. 218.

Primary Examiner—Charles L. Bowers, Jr.
Assistant Examiner—Reneé R. Berry
Attorney, Agent, or Firm—Ostrolenk, Faber, Gerb & Soffen, LLP

[57] ABSTRACT

On a first insulating film covering a substrate, wiring layer patterns are formed. Thereafter, a second insulating film of plasma CVD—$SiO_2$ or the like is formed thereon. A hydrogen silsesquioxane resin film having a flat surface is spin-coated on the second insulating film. Thereafter, the resin film is subjected to a first heat treatment in an inert gas atmosphere to convert the resin film into a silicon oxide film of a preceramic phase. This preceramic silicon oxide film is subjected to a second heat treatment in an oxidizing atmosphere to convert this preceramic silicon oxide film into a silicon oxide film of a ceramic phase. In this case, a fine size projection is generated on the surface of the ceramic silicon oxide film. On the ceramic silicon oxide film, a third insulating film of plasma CVD—PSG or the like is formed which does not reflect the fine size projection. Thereafter, a fourth insulating film of plasma CVD—$SiO_2$ is formed, followed by formation of a second wiring layer. It is possible to planarize an interlevel insulating film and improve a process yield.

18 Claims, 4 Drawing Sheets

METHOD OF FORMING MULTI-LAYER WIRING UTILIZING SOG

BACKGROUND OF THE INVENTION a) Field of the Invention

The invention relates to a method of forming a multi-layer wiring suitable for manufacture of LSIs or the like, and more particularly to a method of forming a multi-layer wiring whose interlevel insulating layer is made of hydrogen silsesquioxane resin or comparable SOG (spin-on-glass).

b) Description of the Related Art

It is known that an interlevel insulating layer of a multi-layer wiring structure can be formed by using hydrogen silsesquioxane resin (e.g., Japanese Patent Laid-open Publication No. 6-181204).

In forming such an interlevel insulating layer, a hydrogen silsesquioxane resin film is coated on the surface of a semiconductor device by spin coating or the like, the resin film is then subjected to a heat treatment in an inert gas atmosphere of $N_2$ or the like to convert the resin film into a silicon oxide film of preceramic phase, and the preceramic silicon oxide film is subjected to another heat treatment in an oxidizing atmosphere of $O_2$ or the like to convert the preceramic silicon oxide film into a silicon oxide film of a ceramic phase. The preceramic silicon oxide film is a precursor of silicon oxide of a ceramic phase, and is premature in its bridging or crosslinking (lower degree of polymerization) and insoluble to organic solvent.

With the above method, a silicon oxide film without cracks having a thickness of even 1 $\mu$m or larger can be formed. Such a silicon oxide film is useful for an interlevel insulating layer.

SUMMARY OF THE INVENTION

It is an object of the present invention to provide a novel method of forming a multi-layer wiring capable of improving a wiring manufacture yield.

According to one aspect of the present invention, there is provided a wiring forming method comprising the steps of: forming a first wiring layer on a first insulating film covering the surface of a substrate; forming a hydrogen silsesquioxane resin film having a flat surface over said first insulating film and said first wiring layer; subjecting said hydrogen silsesquioxane resin film to a first heat treatment under an inert gas atmosphere to convert said resin film in a silicon oxide film of a preceramic phase; subjecting said silicon oxide film to a second heat treatment in an oxidizing atmosphere to convert said preceramic silicon oxide film into a silicon oxide film of a ceramic phase; forming a second insulating film on said ceramic silicon oxide film so that a fine size projection formed on the surface of said ceramic silicon oxide film when said ceramic silicon oxide film is formed is not reflected upon the upper surface of said second insulating film; and forming a second wiring layer on said second insulating film.

Since the second insulating film is formed on the ceramic silicon oxide film so as not to reflect the fine size projection, an interlevel insulating film made of the silicon oxide film and second insulating film can be planarized.

Since the interlevel insulating film can be planarized, a wiring manufacture yield can be improved.

DETAILED DESCRIPTION OF THE PREFERRED EMBODIMENTS

The present inventors have studied a known method of forming an interlevel insulating layer by using hydrogen silsesquioxane and have found that fine size projection of about 0.1 $\mu$m diameter are formed on the surface of a silicon oxide film of a ceramic phase. Generation of such fine size projections lowers a yield of wiring processes. The preliminary experiments made by the present inventors will be described below.

Hydrogen silsesquioxane resin can be spin-coated on a substrate after it is dissolved in solvent of methyl isobutyl ketone (MIBK). Therefore, from the viewpoint of processes, this resin is the same as conventional SOG (spin-on-glass), mostly organic siloxisane SOG. Hydrogen silsesquioxane resin has a chemical formula of $(HSiO_{3/2})_n$ and is chemically inorganic SOG.

When hydrogen silsesquioxane resin is heated and reflowed, its planarization is superior to conventional SOG, and even if a resin film is formed thick, its high planarization can be retained. As products, "Flowable Oxide" (trade name) manufactured by Dow Corning Co. is known.

Figure 2A:
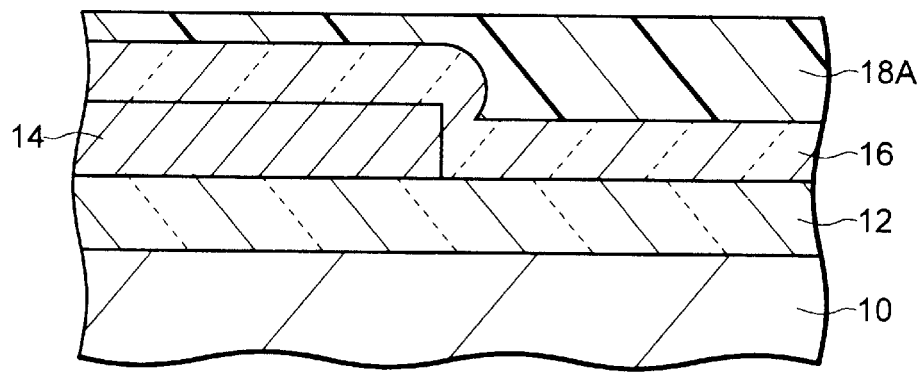
FIGS. 2A to 2C are cross sectional views of a substrate illustrating the main processes of preliminary experiments made by the present inventors by using a conventional multi-layer wiring forming method.
Figure 2B:
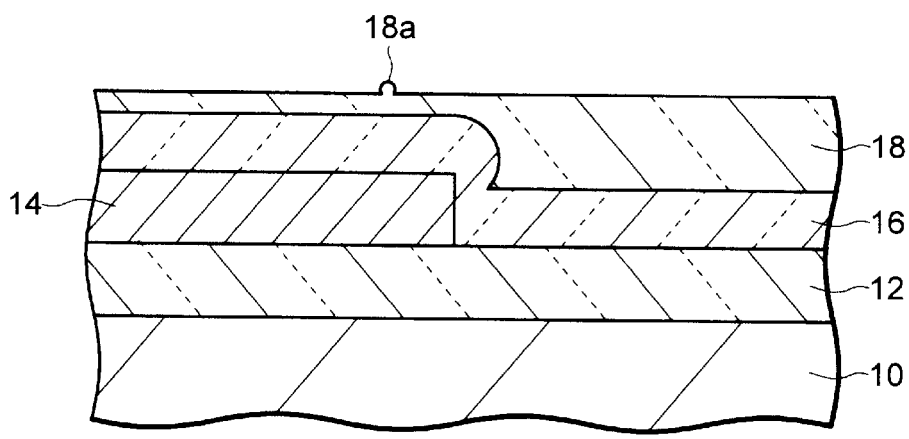
Figure 2C:
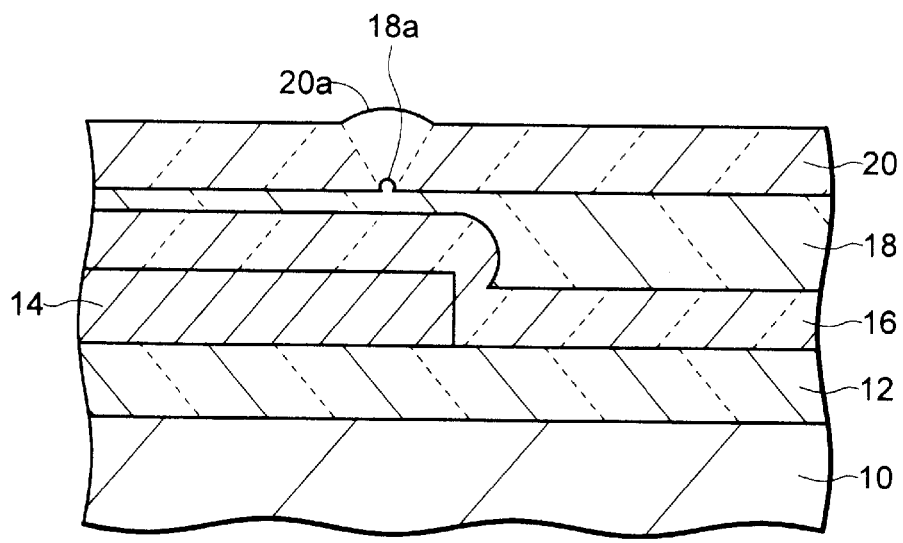

FIGS. 2A to 2C illustrate a multi-layer wiring forming method used by preliminary experiments.

Referring to FIG. 2A, an insulating film 12 of silicon oxide or the like is formed on the surface of a semiconductor substrate 10. A wiring layer 14 is formed on the insulating film 12. An insulating film 16 of silicon oxide is formed by plasma CVD (chemical vapor deposition), covering the insulating film 12 and wiring layer 14. Solution of hydrogen silsesquioxane resin dissolved in methyl isobutyl ketone (MIBK) is spin-coated over the substrate to form a hydrogen silsesquioxane resin film 18A with a flat surface on the insulating film 16.

Referring to FIG. 2B, the resin film 18A is heat treated in an inert gas atmosphere to convert it into a silicon oxide film 18 of a preceramic phase. Heat treatment is further performed in a mixed gas atmosphere of $O_2$ and inert gas to convert the preceramic silicon oxide film 18 into a silicon oxide film of a ceramic phase.

At this time, a fine size projection 18a of about 0.1 $\mu$m diameter may sometimes be formed on the surface of the silicon oxide film 18 of a ceramic phase.

Referring to FIG. 2C, an insulating film 20 of silicon oxide is formed by plasma CVD, covering the ceramic silicon oxide film 18.

At this time, a convex 20a is formed on the surface of the insulating film 20 over the fine size projection 18a on the silicon oxide film, reflecting the fine size projection 18a with a high fidelity. As will be explained later, the quality of the insulating film 20 at the convex indicated by broken lines is degraded.

As above, generation of the fine size projection 18a and the convex 20a deforms the shape of a via hole.

Figure 3A:
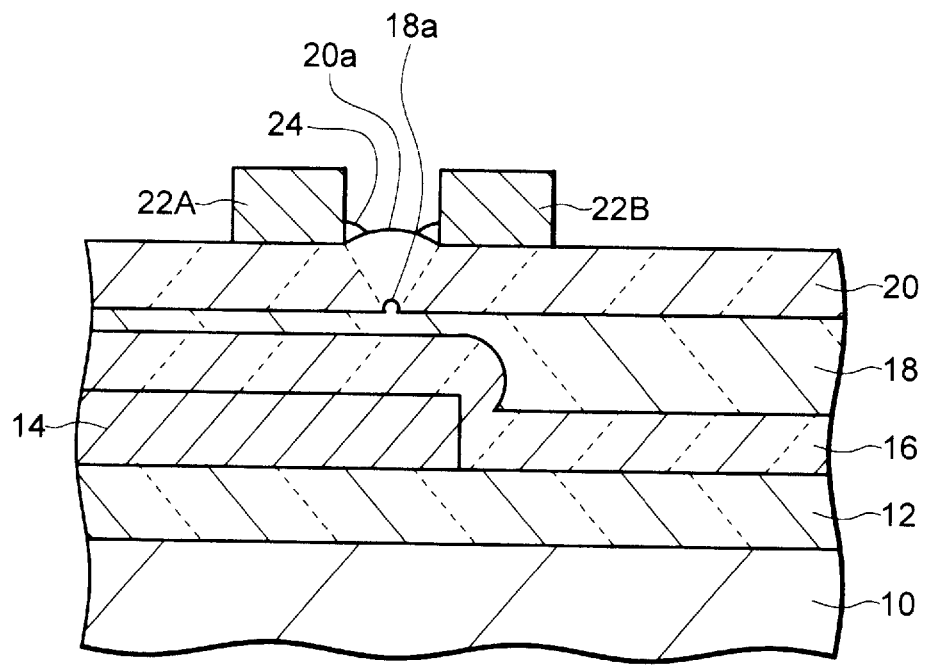
FIGS. 3A and 3B are a cross sectional view and a plan view showing the state of wiring layers formed near a convex area of an interlevel insulating film.
Figure 3B:
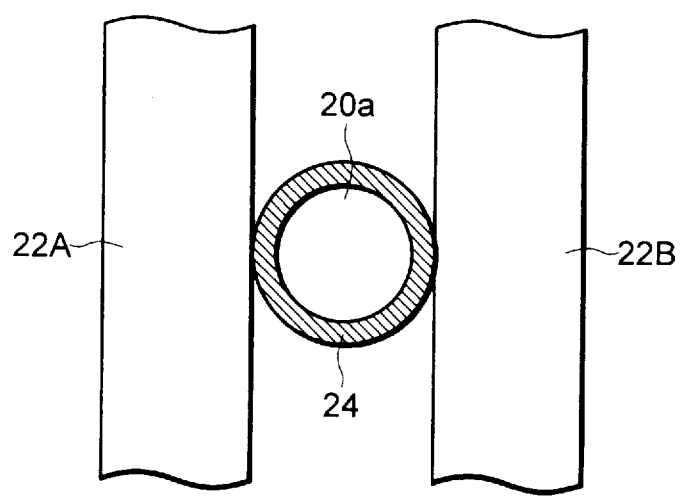

FIGS. 3A and 3B show short-circuit occurring at the time of patterning wiring patterns. FIG. 3A is a cross section of a substrate, and FIG. 3B is a plan view of the substrate.

After the process shown in FIG. 2C, a wiring material is deposited over the substrate and patterned by selective etching to form the wiring layer. In this case, if adjacent wiring layers 22A and 22B are formed facing each other near at the convex 20a, a portion of the wiring layer is left as an etching residue 24 around the convex 20a as shown in FIGS. 3A and 3B. This etching residue 24 electrically short-circuits the wiring layers 22A and 22B.

As above, a planarized insulating film using hydrogen silsesquioxane may form a fine size projection on the surface thereof. It has been found that if an insulating film and a wiring layer are formed on this planarized insulating film with a fine size projection, this fine size projection may cause a short-circuit between wiring patterns. In the following, an embodiment of the invention will be described.

This embodiment pertains to a method of manufacturing a semiconductor device wherein an insulating interlayer is formed using spin-on-glass made of hydrogen silsesquioxane resin $(HSiO_{3/2})_n$. After hydrogen silsesquioxane resin is coated, it is heated to convert it into an oxide film of a preceramic phase, and then further heated to ceramify the hydrogen silsesquioxane resin into a first insulating interlayer. On this first insulating interlayer, a non-conformal second insulating interlayer (PSG by atmospheric pressure CVD or other films) is formed.

Even if a fine size projection is formed on the first insulating interlayer of the hydrogen silsesquioxane resin ceramified by the second heat treatment, a convex reflecting this fine size projection is not formed in the second insulating interlayer. It is therefore possible to prevent a residue from being formed at a later etching process.

FIGS. 1A to 1D illustrate a method of forming a multi-layer wiring according to an embodiment of the invention. Processes (1) to (4) corresponding to FIGS. 1A to 1D will be sequentially described.

Figure 1A:
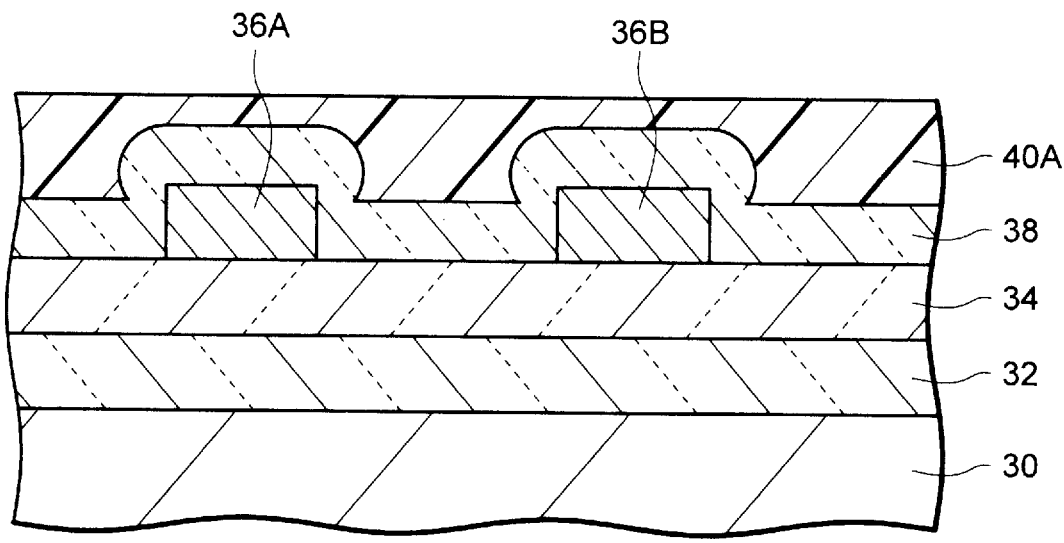
FIGS. 1A to 1D are cross sectional views of a substrate illustrating the main processes of a method of forming a multi-layer wiring according to an embodiment of the invention.

(1) As shown in FIG. 1A, an insulating film 32 of silicon oxide or the like is formed on the surface of a semiconductor substrate 30 of silicon or the like. For example, the insulating film 32 is a field oxide film formed through local oxidation of silicon (LOCOS) and has apertures exposing active regions. Each active region is formed with a metal-oxide-semiconductor (MOS) transistor by known methods.

An insulating film 34 of borophosphosilicate glass (BPSG) is deposited to a thickness of 750 nm by atmospheric pressure CVD or the like. The insulating film 34 is subjected to lamp annealing to make the film quality dense.

Examples of the conditions of forming the insulating film 34 are as follows:

Substrate Temperature: 400° C.
Source Gas: $SiH_4$(46.25 sccm)+$PH_3$(8.75 sccm)+$B_2H_6$ (7.5 sccm)+$O_2$(7000 sccm)+$N_2$(50000 sccm)

Examples of the conditions of lamp annealing are as follows:

Substrate Temperature: 850° C.
Temperature Rise Time to 850° C.: 10 seconds
Keeping Time at 850° C.: 10 seconds Next, a wiring material layer is formed over the substrate by sputtering or the like, and a resist pattern is formed on the wiring material layer. By using the resist pattern as a mask, the wiring material layer is selectively dry-etched and patterned to form wiring layers 36A and 36B. The resist pattern is removed thereafter. An example of the wiring material layer is a laminate of a Ti layer (20 nm), a TiON layer (100 nm), an Al—Si—Cu alloy layer (400 nm), and a TiN layer (40 nm) stacked in this order from the bottom. Examples of the conditions of dry etching are as follows:

Etching Gas: $Cl_2$(30 sccm)+$BCl_3$(30 sccm)
Etching Chamber Pressure: 10 mTorr Next, an insulating film 38 of silicon oxide ($SiO_2$) is formed on the insulating film 34 to a thickness of 300 nm by CVD, covering the wiring layers 36A and 36B. Example of the conditions of forming the insulating film 38 are as follows:

Substrate Temperature: 400° C.
Source Gas: $SiH_4$(240 sccm)+$N_2O$(5000 sccm)+$N_2$(2800 sccm)
Reaction Chamber Pressure: 2.2 Torr Next, a hydrogen silsesquioxane resin film 40A having a planarized surface is formed over the insulating film 38. For example, the resin film 40A was formed by coating, with a spin coater, solution of hydrogen silsesquioxane resin dissolved in MIBK to a thickness of 500 nm. The thickness of the resin film 40A is optional in the range from 300 to 600 nm.

Figure 1B:
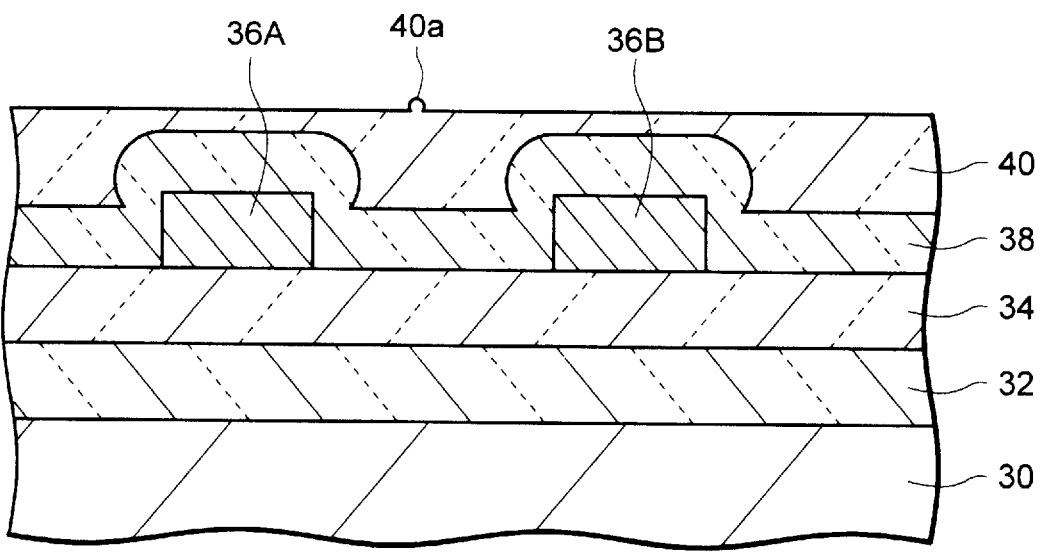

(2) As shown in FIG. 1B, the resin film is subjected to a heat treatment in an inert gas atmosphere to convert the resin film 40A into a preceramic silicon oxide film 40. In this heat treatment, for example, $N_2$ gas is used as the inert gas and heating continues for 1 to 60 minutes at a temperature in the range from 150° C. or higher and lower than 350° C. In one example, the heat treatment was performed for one minute at 150° C.+one minute at 200° C.+one minute at 300° C., in an $N_2$ gas atmosphere using a hot plate.

The heating temperature is preferably 300° C. or lower in order to retain the fluidity of hydrogen silsesquioxane resin and reliably prevent fine size projections from being formed.

Next, another heat treatment is performed so that the preceramic silicon oxide film 40 is converted into a ceramic silicon oxide film. Specifically, the heat treatment is performed for 5 to 120 minutes at 350 to 500° C. in an oxidizing atmosphere of oxygen gas (or mixed gas of oxygen gas and inert gas) or the like. In one example, the heat treatment was performed for 60 minutes at 400° C. in an atmosphere of mixed gas of $O_2$ and $N_2$.

After this second heat treatment, a silicon oxide film 40 of a ceramic phase can be obtained. In this case, a fine size projection 40a about 0.1 μm diameter may be formed on the surface of the silicon oxide film 40.

Figure 1C:
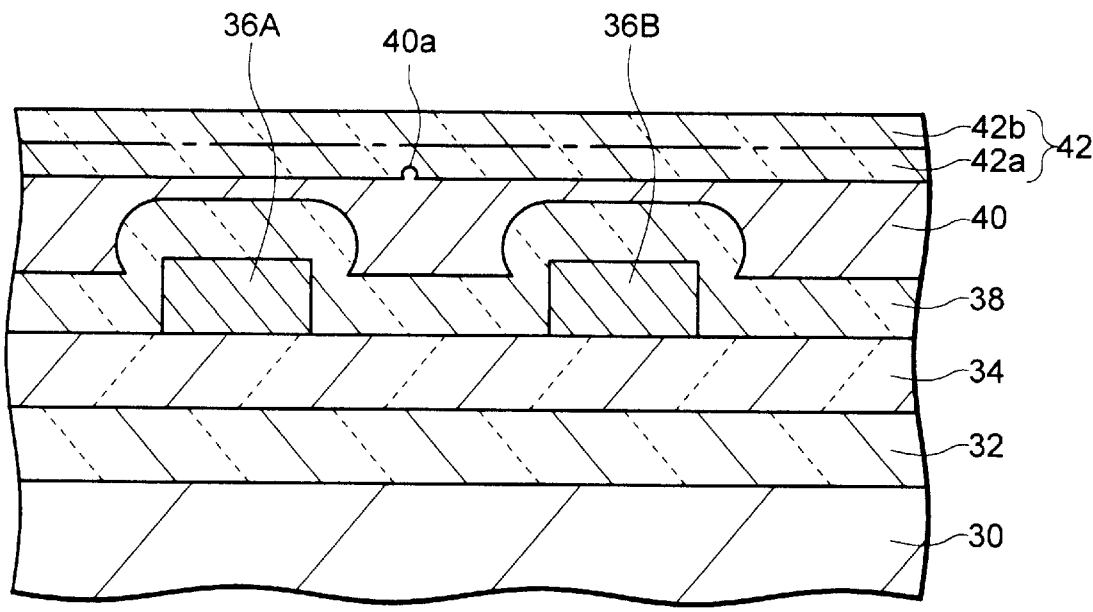

(3) As shown in FIG. 1C, an insulating film 42a of PSG (phosphosilicate glass) is formed to a thickness of 150 nm by a method providing a good step coverage, e.g., atmospheric pressure CVD. Examples of the conditions of forming the insulating film 42a are as follows:

Substrate Temperature: 400° C.
Source Gas: $SiH_4$(240 sccm)+$PH_3$(70 sccm)+$N_2O$(5000 sccm)+$N_2$(2730 sccm)

The insulating film 42a formed in the above manner is a non-conformal film. Even if a fine size projection 40a is formed on the underlying first interlayer insulating film 40 made of hydrogen silsesquioxane resin, the upper level second interlayer insulating film 42a does not reflect the fine size projection 40a. Therefore, the upper surface of the second interlayer insulating film 42a has no convex and is flat.

Next, an insulating film 42b of silicon oxide film ($SiO_2$) is formed to a thickness of 350 nm by plasma CVD, covering the insulating film 42a. Examples of the conditions of forming the insulating film 42b are as follows:

Substrate Temperature: 400° C.
Source Gas: $SiH_4$(240 sccm)+$N_2O$(5000 sccm)+$N_2$(2800 sccm)

Reaction Chamber Pressure:2.2 Torr

The silicon oxide film 42b may be a silicon oxide film formed by the following method (a) or (b).

(a) Plasma CVD using as source gases TEOS (Tetra Ethyl Ortho Silicate [$Si(OC_2H_5)_4$]) and $O_2$. Examples of the conditions of this film forming method are as follows:

Substrate Temperature:400° C.

Source Gas:TEOS (1.8 cc/min [supplied in liquid])+$O_2$ (8000 sccm)

Reaction Chamber Pressure:2.2 Torr (b) Sputtering with a target of $SiO_2$. Examples of the conditions of this film forming method are as follows:

System Used:RF sputtering system (13.56 MHz)

Substrate Temperature:200° C.

Target:$SiO_2$

Reaction Chamber Pressure:6 mTorr

Atmosphere in Reaction Chamber:mixed gas of Ar and $O_2$

Figure 1D:
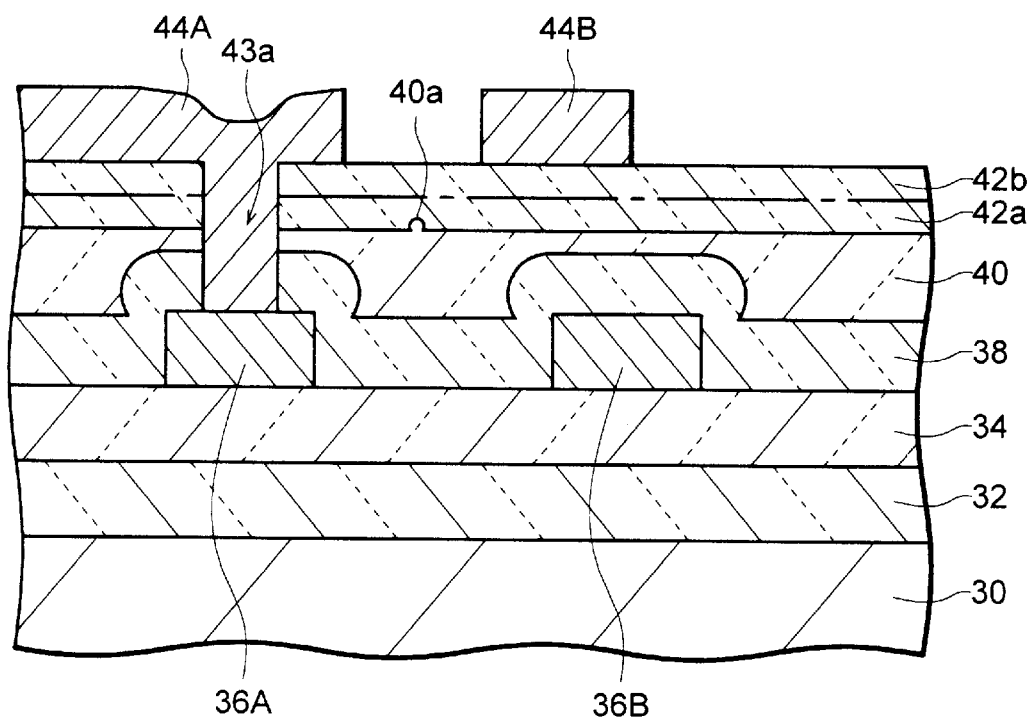

RF Power:1 KW (4) As shown in FIG. 1D, after a via hole 43a is formed at a position, for example, corresponding to the wiring layer 36A, by known photolithography and dry etching, a wiring material layer is formed over the substrate by sputtering or the like and a resist pattern is formed on the wiring layer. By using the resist pattern as a mask, the wiring material layer is patterned through selective dry etching to form wiring patterns 44A and 44B. The wiring layer 44A is connected via the via hole 43a to the wiring layer 36A. The wiring material layer was formed by sputtering Al—Si—Cu alloy to a thickness of 400 nm. Examples of the conditions of dry etching were as follows:

Etching Gas:$Cl_2$(30 sccm)+$BCl_3$(30 sccm)

Etching Chamber Pressure:10 mTorr

Even if the fine size projection is present under the region between the wiring patterns 44A and 44B, the convex such as shown in FIGS. 2A to 2C does not exist at this region. Therefore, the wiring layers 44A and 44B are not electrically short-circuited by an etching residue of the wiring material layer.

The insulating film 38 also has a function of suppressing hillock generation of the wiring layers 36A and 36B. In some cases, the insulating film 38 may be omitted and the hydrogen silsesquioxane resin film 40A is formed to directly cover the insulating film 34 and wiring layers 36A and 36B.

Although a PSG film formed by atmospheric pressure CVD is used as the insulating film 42a, other films may also be used. For example, these films include a BPSG film formed by atmospheric pressure CVD, a silicon oxide film formed by atmospheric pressure CVD using TEOS and $O_2$ as source gas, an inorganic SOG (spin-on-glass) formed by spin coating, and the like.

Of the interlevel insulating films between the wiring layers 36A and 36B and the wiring layers 44A and 44B, the uppermost insulating film 42b is desired to satisfy the conditions that cracks are difficult to be formed, that hygroscopicity is low, and that it can be formed at a low temperature. An insulating film formed by the above-described two types of methods, plasma CVD and sputtering, satisfies the above conditions and is suitable for the insulating film 42b. In some cases, the insulating film 42b may be omitted and the wiring patterns 44A and 44B may be formed directly on the insulating film 42a.

The two wiring layers described above may be any pair of adjacent wiring layers of multi-layer wiring layers, or another wiring layer may be interposed between such a pair of adjacent wiring layers.

Instead of a hydrogen silsesquioxane resin film, an SOG film having a similar chemical nature may be used.

Although the present invention has been described in connection with the preferred embodiments, the invention is not limited only to the above embodiments. It is apparent to those skilled in the art that various modifications, improvements, combinations and the like can be made without departing from the scope of the appended claims.

We claim:

1. A wiring forming method comprising the steps of:

forming a first wiring layer on a first insulating film covering the surface of a substrate;

forming a hydrogen silsesquioxane resin film having a flat surface over said first insulating film and said first wiring layer;

subjecting said hydrogen silsesquioxane resin film to a first heat treatment in an inert gas atmosphere to convert said resin film into a silicon oxide film of a preceramic phase;

subjecting said silicon oxide film to a second heat treatment in an oxidizing atmosphere to convert said preceramic silicon oxide film into a silicon oxide film of a ceramic phase;

forming a second insulating film on said ceramic silicon oxide film so that a fine size projection which may be formed on the surface of said ceramic silicon oxide film when said ceramic silicon oxide film is formed is not reflected upon the upper surface of said second insulating film, said step of forming said second insulating film being performed by using one of a method of forming a phosphosilicate glass film or a borophosphosilicate glass film by atmospheric pressure chemical vapor deposition (CVD), a method of forming a silicon oxide film by atmospheric pressure CVD using tetra ethyl ortho silicate as a silicon source material, and a method of forming an inorganic film by spin coating; and forming a second wiring layer on said second insulating film.

2. A wiring forming method according to claim 1, wherein said first heat treatment is performed in a temperature range of 150° C. or higher and lower than 350° C.

3. A wiring forming method according to claim 2, wherein said first heat treatment is performed at a temperature of 300° C. or lower.

4. A wiring forming method according to claim 1, wherein the inert gas atmosphere of said first heat treatment is nitrogen gas.

5. A wiring forming method according to claim 1, wherein said second heat treatment is performed in a temperature range from 350° C. to 500° C.

6. A wiring forming method according to claim 5, wherein said second heat treatment is performed for a period of 5 minutes to 120 minutes.

7. A wiring forming method according to claim 1, wherein said hydrogen silsesquioxane resin film has a thickness in a range from 300 nm to 600 nm after said first heat treatment.

8. A wiring forming method comprising the steps of:

forming a first wiring layer on a first insulating film covering the surface of a substrate;

forming a hydrogen silsesquioxane resin film having a flat surface over said first insulating film and said first wiring layer;

subjecting said hydrogen silsesquioxane resin film to a first heat treatment in an inert gas atmosphere to convert said resin film into a silicon oxide film to a second heat treatment in an oxidizing atmosphere to convert said preceramic silicon oxide film into a silicon oxide film of a ceramic phase;

forming a second insulating film on said ceramic silicon oxide film so that a fine size projection which may be formed on the surface of said ceramic silicon oxide film when said ceramic silicon oxide film is formed is not reflected upon the upper surface of said second insulating film;

forming a second wiring layer on said second insulating film; and forming a third insulating film after said step of forming said second insulating film and before said step of forming said second wiring layer.

9. A wiring forming method according to claim 8, wherein said step of forming said third insulating film is performed by plasma CVD or sputtering.

10. A wiring forming method according to claim 9, wherein said third insulating film is made of silicon oxide.

11. A wiring forming method according to claim 1, further comprising the step of forming a surface covering insulating film by CVD between said step of forming said first wiring layer and said step of forming said hydrogen silsesquioxane resin film.

12. A wiring forming method according to claim 11, wherein said step of forming said surface covering insulating film comprises forming a silicon oxide film by plasma CVD.

13. A wiring forming method comprising the steps of:

forming a first wiring layer on a first insulating film covering the surface of a substrate;

forming a spin-on-glass (SOG) film having a flat surface over said first insulating film and said first wiring layer;

subjecting said SOG film to a first heat treatment in an inert gas atmosphere to convert said SOG film into a silicon oxide film of a preceramic phase;

subjecting said silicon oxide film to a second heat treatment in an oxidizing atmosphere to convert said preceramic silicon oxide film into a silicon oxide film of a ceramic phase;

forming a second insulating film on said ceramic silicon oxide film so that a fine size projection which may be formed on the surface of said ceramic silicon oxide film when said ceramic silicon oxide film is formed is not reflected upon the surface of said second insulating film, said step of forming said second insulating film being performed by using one of a method of forming a phosphosilicate glass film or a borophosphosilicate glass film by atmospheric pressure chemical vapor deposition (CVD), a method of forming a silicon oxide film by atmospheric pressure CVD using tetra ethyl ortho silicate as a silicon source material, and a method of forming an inorganic film by spin coating; and forming a second wiring layer on said second insulating film.

14. A wiring forming method comprising the steps of:

forming a first wiring layer on a first insulating film covering the surface of a substrate;

forming a spin-on-glass (SOG) film having a flat surface over said first insulating film and said first wiring layer;

subjecting said SOG film to a first heat treatment in an inert gas atmosphere to convert said SOG film into a silicon oxide film of a preceramic phase;

subjecting said silicon oxide film to a second heat treatment in an oxidizing atmosphere to convert said preceramic silicon oxide film into a silicon oxide film of a ceramic phase;

forming a second insulating film on said ceramic silicon oxide film so that a fine size projection which may be formed on the surface of said ceramic silicon oxide film when said ceramic silicon oxide film is formed is not reflected upon the surface of said second insulating film;

forming a second wiring layer on said second insulating film; and forming a third insulating film and before said step of forming said second wiring layer.

15. A wiring forming method according to claim 14, wherein said step of forming said third insulating film is performed by plasma CVD or sputtering.

16. A wiring forming method according to claim 15, wherein said third insulating film is made of silicon oxide.

17. A wiring forming method according to claim 13, further comprising the step of forming a surface covering insulating film by CVD between said step of forming said first wiring layer and said step of forming said hydrogen silsesquioxane resin film.

18. A wiring forming method according to claim 17, wherein said step of forming said surface covering insulating film comprises forming a silicon oxide film by plasma CVD.

* * * * *